US007071864B2

(12) United States Patent
Wang

(10) Patent No.: US 7,071,864 B2
(45) Date of Patent: Jul. 4, 2006

(54) AUTOMATIC THRESHOLD VOLTAGE CONTROL CIRCUIT AND SIGNAL CONVERTING CIRCUIT AND METHOD THEREOF

(75) Inventor: Yao-Chi Wang, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/707,867

(22) Filed: Jan. 20, 2004

(65) Prior Publication Data
US 2005/0052309 A1    Mar. 10, 2005

(30) Foreign Application Priority Data
Sep. 9, 2003    (TW) .............................. 92124839 A

(51) Int. Cl.
*H03M 1/12*    (2006.01)
(52) U.S. Cl. ...................... 341/172; 341/120; 341/122
(58) Field of Classification Search ............... 341/118, 341/120–122, 123–125, 155–172
See application file for complete search history.

(56) References Cited

U.S. PATENT DOCUMENTS

| | | | | |
|---|---|---|---|---|
| 4,982,194 A | * | 1/1991 | Bacrania et al. ............ | 341/172 |
| 5,995,036 A | * | 11/1999 | Nise et al. .................... | 341/172 |
| 6,025,794 A | * | 2/2000 | Kusumoto et al. .......... | 341/172 |
| 6,052,000 A | * | 4/2000 | Nagaraj ........................ | 327/94 |
| 6,124,819 A | * | 9/2000 | Zhou et al. ................... | 341/155 |
| 6,400,214 B1 | * | 6/2002 | Aram et al. .................. | 327/541 |
| 6,838,930 B1 | * | 1/2005 | Huynh ........................... | 330/9 |
| 6,864,919 B1 | * | 3/2005 | Hua ............................... | 348/241 |
| 6,943,721 B1 | * | 9/2005 | Aswell et al. ............... | 341/172 |

* cited by examiner

*Primary Examiner*—Linh Nguyen
(74) *Attorney, Agent, or Firm*—Jianq Chyun IP Office

(57) ABSTRACT

An automatic threshold voltage control circuit is provided. The circuit comprises a first capacitor, a clock generator, and a switching capacitor network. Wherein the switching capacitor network, receives an analog signal and a plurality of clock signals from the clock generator, where the switching capacitor network stores a portion of charges of the analog signal according to one clock signal, and outputting the portion of charges in according to another clock signal. The portion of charges being associated with the first capacitor generates a threshold voltage. A plurality of sensor control switches is adopted in the present invention in replace of the resistor in the conventional RC filter. Hence, it can be easily integrated into one chip and number of the external devices is reduced, so that hardware costs down. In addition, RC constant can be adjusted by tuning the frequency of the clock signal.

11 Claims, 2 Drawing Sheets

US 7,071,864 B2

AUTOMATIC THRESHOLD VOLTAGE CONTROL CIRCUIT AND SIGNAL CONVERTING CIRCUIT AND METHOD THEREOF

CROSS REFERENCE TO RELATED APPLICATIONS

This application claims the priority benefit of Taiwan application serial no. 92124839, filed on Sep. 9, 2003.

BACKGROUND OF INVENTION

1. Field of the Invention

This invention generally relates to a receiving circuit in integrated circuits, and more particularly to an automatic threshold voltage circuit for digital communication and signal converting circuit and method thereof, and more particularly for frequency-shift keying (FSK), amplitude-shift keying (ASK), and on-off keying (OOK) digital communication systems.

2. Description of Related Art

As technology advances, digital communication becomes an indispensable tool for our daily life. Hence, a fast and reliable digital communication system such as FSK/ASK digital communication system is necessary for business or military purpose. In a FSK/ASK digital communication system, the receiving terminal has a comparator to determine if the received bit is logic 1 or 0. One of the comparator input receives the analog signal; the other input receives a threshold voltage. If the voltage of the analog signal is higher than the threshold voltage, the comparator will determine that the received signal is logic 1 (or logic 0). Otherwise, the comparator will determine that the received signal is logic 0 (or logic 1).

Among conventional methods for generating threshold voltage is to use a fixed voltage source as the threshold voltage on chip. FIGS. 1A to 1C show the circuit and the timing of the signal of a conventional analog-to-digital converter where fixed voltage source is provided. Referring to FIG. 1A, the threshold voltage $V_{REF}$ is supplied by a fixed voltage source. The comparator 110 receives the analog signal $V_{IN}$ and compares the analog signal $V_{IN}$ with the threshold voltage $V_{REF}$. As shown in FIG. 1B, if $V_{IN}$ is higher than $V_{REF}$, the received analog signal is determined as logic 1 (or logic 0). Otherwise, it is logic 0 (or logic 1). Then the comparator outputs $V_{out}$ according to the result. Ideally, the threshold voltage $V_{REF}$ is equal to the average value (DC level) of the analog signal $V_{IN}$. Practically, however, the DC level of the analog signal changes with factors such as temperature, communication ambiance, and parameter migration in manufacturing process. FIG. 1C illustrates the phenomenon, where the analog signal $V_{IN}$ is affected by the above factors so that the DC level of $V_{IN}$ is higher than threshold voltage $V_{REF}$. Therefore, the comparator 110 will possibly output an incorrect $V_{out}$.

To eliminate the drawbacks of the conventional design with fixed threshold voltage, a filter circuit consisting of a resistor and a capacitor (RC filter) was used to filter out the AC component of the analog signal to obtain the DC level of the analog signal as the threshold voltage. Referring to FIG. 2, a conventional analog-to-digital converter that automatically controls threshold voltage using a RC filter is illustrated. The resistor 230 receives the analog signal $V_{IN}$ and is coupled to the capacitor 220 to output the threshold voltage $V_{REF}$. The other terminal of the capacitor is coupled to ground. The comparator 210 receives and compares the analog signal $V_{IN}$ with the threshold voltage $V_{REF}$ and outputs $V_{out}$. In this conventional circuit, although the threshold voltage is generated corresponding to analog signal migration, a large resistor and capacitor is required for low-speed analog signal transmission. For example, if the data rate of the analog signal is 1 Kbps, the required RC constant must be larger than 1 msec; i.e., it requires a 1MΩ resistor and a 1000 pF capacitor, which occupies a large area on the integrated circuit chip. For instance, in a CMOS 0.6 μm process, it requires an chip area of 12 μm×12 μm per 1KΩ and 20 μm×20 μm per 1 pF. Hence, the conventional RC filter is not suitable for an integrated circuit. In addition, once the capacitance and resistance have been determined and integrated into the circuit, the RC time constant is no longer adjustable.

SUMMARY OF INVENTION

An object of the present invention is to provide an automatic threshold voltage control circuit and the signal converting circuit and method thereof to effectively reduce the capacitance so as to be easily integrated into the circuit.

Another object of the present invention is to provide an automatic threshold voltage control circuit and the signal converting circuit and method applying thereof to reduce number of the external devices so that system manufacturing costs down.

Still another object of the present invention is to provide an automatic threshold voltage control circuit and the signal converting circuit and method thereof to adjust the RC constant by switching the frequency of the clock signal.

The present invention provides an automatic threshold voltage control circuit, comprising a first capacitor, a clock source, and a switching capacitor network. The first capacitor comprises a first terminal and a second terminal, wherein the first terminal is coupled to a first voltage level. The clock generator is for generating a plurality of clock signals. The switching capacitor network, coupled to the second terminal of the first capacitor, receives an analog signal and the clock signals, stores a portion of charges of the analog signal according to one clock signal, and outputs the portion of charges according to another clock signal. A threshold voltage is thus generated, in association with the first capacitor.

According to one preferred embodiment of the present invention, the switching capacitor network comprises a plurality of sensor control switches and a second capacitor. One of the sensor control switches is controlled by a clock signal for switching on/off. The sensor control switches are interconnected in series, and receives from one terminal of the series-connected structure, whereas the other terminal of which couples to the second terminal of the first capacitor, so as to output the threshold voltage. In the connected structure, the node between adjacent two sensor control switches is coupled to one terminal of the second capacitor, and the other terminal of the second capacitor is coupled to a second voltage level. The foregoing clock signals possess same frequency but different phases, and none of the clock signals overlaps to another. The present invention also applies to FSK, ASK, or OOK communication system.

The present invention also provides an analog-to-digital signal converter circuit comprising a first capacitor, a clock generator, a switching capacitor network, and a comparator. The clock generator is for generating a plurality of clock signals, where each clock signal possesses a same frequency with different phases. The first capacitor comprises a first terminal and a second terminal, where the first terminal is coupled to a first voltage level. The clock generator generates a plurality of clock signals. The switching capacitor network, coupled to the second terminal of the first capacitor, receives an analog signal and the clock signals, stores a portion of charges of the analog signal according to one clock signal, and outputs the portion of charges according to another clock signal. A threshold voltage is thus generated, in association with the first capacitor, and the comparator compares the threshold voltage with the analog signal and outputs a digital signal.

According to one preferred embodiment of the present invention, the switching capacitor network comprises a plurality of sensor control switches and a second capacitor. One of the sensor control switches is controlled by a clock signal for switching on/off. The sensor control switches are interconnected in series, and receives from one terminal of the series-connected structure, whereas the other terminal of which couples to the second terminal of the first capacitor, so as to output the threshold voltage. In the connected structure, the node between adjacent two sensor control switches is coupled to one terminal of the second capacitor, and the other terminal of the second capacitor is coupled to a second voltage level. The foregoing clock signals possess same frequency but different phases, and none of the clock signals overlaps to another. The present invention also applies to FSK, ASK, or OOK communication system.

Since conventional RC filter occupies a significant chip area in an integrated circuit, where the RC constant is neither adjustable, the present invention provides an automatic threshold voltage control circuit to eliminate the drawbacks of the conventional RC filter. Since the present invention provides a switching capacitor network including a plurality of sensor control switches and capacitors in replace of the resistor in the conventional RC filter, it is easier to integrate and reduce number of external devices, thus hardware cost is cut down. In addition, the RC constant is adjustable by controlling the frequency of the clock signal in this present invention.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

As mentioned above, the conventionally RC filer circuit is implemented for automatic threshold voltage control, however, the resistor and capacitor occupies a significant chip area of IC, integration is not considered in this case. External resistor and capacitor can be connected to the IC to obtain the same effect, yet device cost is increased. Hence, the present invention provides an automatic threshold voltage control circuit to eliminate the drawbacks of the conventional RC filter circuit.

Figure 1A:
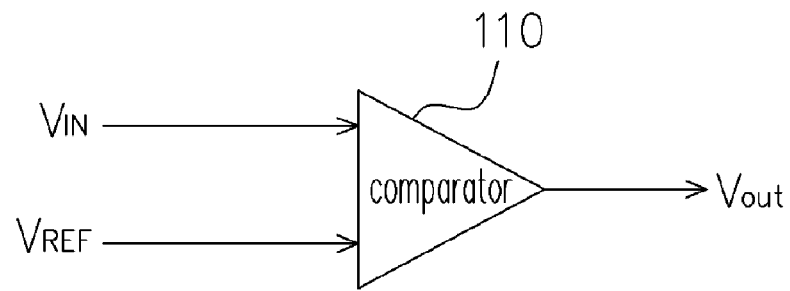
FIGS. 1A–1C illustrate the circuit and the timing diagrams of the signals thereof in a conventional analog-to-digital converter.
Figure 1B:
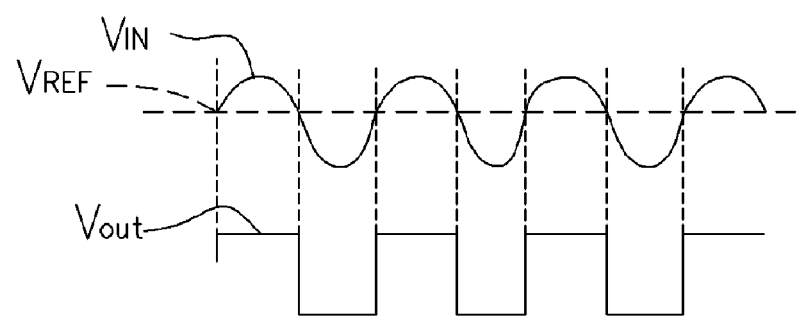
Figure 1C:
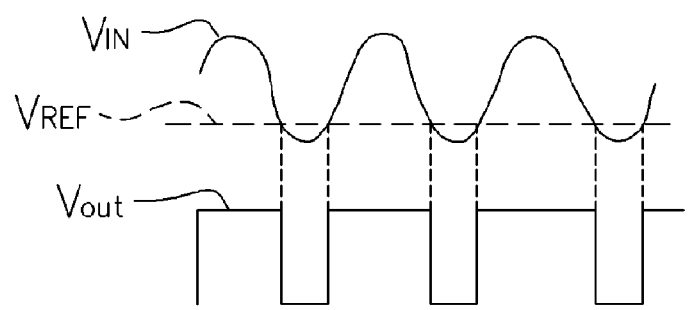
Figure 2:
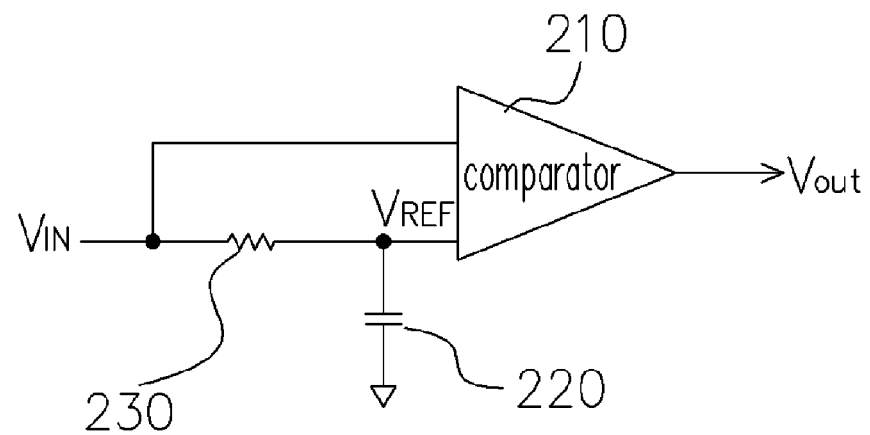
FIG. 2 illustrates the circuit of an analog-to-digital converter with a conventional RC filter.
Figure 3:
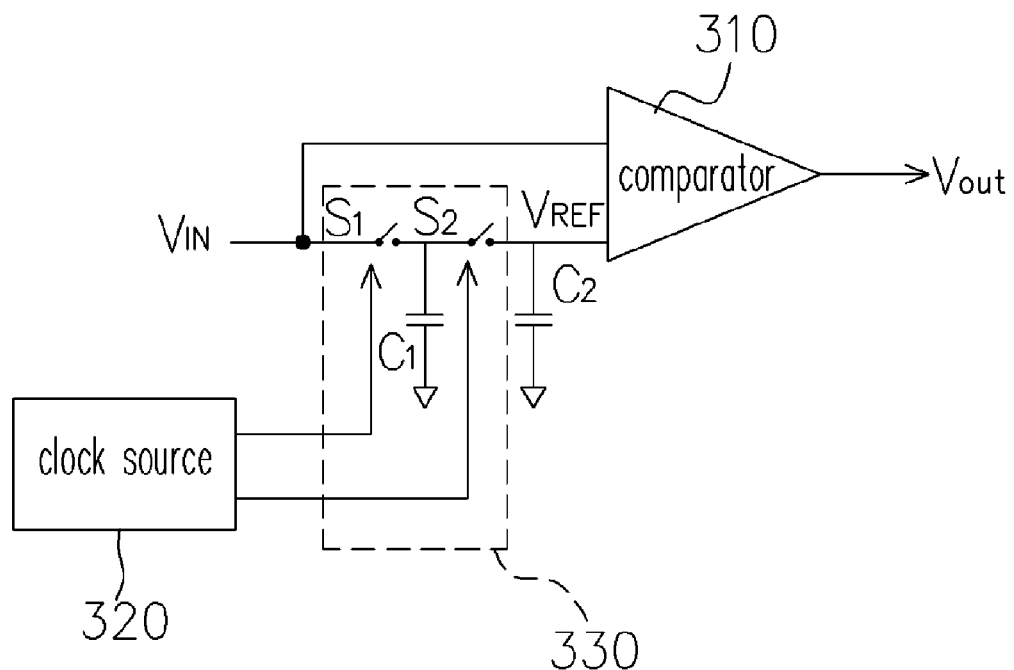
FIG. 3 illustrates an automatic threshold voltage control circuit and the analog-to-digital converter circuit in accordance with a preferred embodiment of the present invention.

FIG. 3 illustrates an automatic threshold voltage control circuit and the analog-to-digital converter circuit thereof in accordance with one preferred embodiment in the present invention. The circuit of this preferred embodiment comprises a capacitor C1, a capacitor C2, a sensor switcher S1, a sensor switcher S2, and a clock generator 320. The switching capacitor network 330 receives the clock signals from the clock generator to control one of the sensor switchers S1 and S2 so that only one of S1 and S2 is off and the other is on. When the sensor switchers S1 and S2 are on and off alternatively in response to the clock signals, the capacitor C1 will store a portion of charges ΔQ of the analog signal $V_{IN}$ when the sensor switcher S1 is on, wherein $$\Delta Q = C1(V_{IN} - V_{REF}) \qquad (1)$$

In this preferred embodiment, the capacitance of C1 is 0.5 pF, for example. The average current $I_{avg}$ flowing through the switching capacitor network 330 is shown as follows:

$$I_{avg} = \Delta Q/T = C1*f(V_{IN} - V_{REF}) \qquad (2)$$

In this embodiment, the frequency f is 40 KHz, for example. The equivalent resistor $R_{eff}$ of the switching capacitor network 330 is $$R_{eff} = (V_{IN} - V_{REF})/I_{avg} = 1(C1*f) \qquad (3)$$

If the clock generator 320 is appropriately adjusted so that the clock signal controlling the sensor control switch S1 and the clock signal controlling the sensor control switch S2 possess the same frequency with different phases yet not overlapping, the switching capacitor network 330 associated with the capacitor C2 serves as RC filter and manages to generate the threshold voltage $V_{REF}$ therein. In this embodiment, the capacitor C2 is 10 pF, for example. Although C1 and C2 are coupled to ground at one end, it is known for the skill in the art that to couple C1 and C2 to different voltage levels is within the scope of the present invention.

In a preferred embodiment of the present invention, the sensor control switches can be implemented with Metal-Oxide-Semiconductor Field-Effect Transistors, or MOSFETs, in order to be easily integrated into an IC. The automatic threshold voltage control circuit of the present invention can be applied to FSK, ASK, or OOK communication system.

A signal converting circuit according to another preferred embodiment of the present invention will be illustrated as follows. This embodiment is substantially similar to the previous preferred embodiment, yet that the threshold voltage $V_{REF}$ is further introduced to a comparator 310. Referring to FIG. 3, the switching capacitor network 330 is equivalent to a resistor, so that to form a RC filter that is associated with the capacitor C2. The comparator 310 receives and compares the analog signal $V_{IN}$ and the threshold voltage $V_{REF}$ to generate the digital signal $V_{out}$.

Hence, the present invention provides a signal converting method for converting an analog signal to a digital signal. Firstly, a first capacitor and a plurality of clock signals are provided. A portion of charges of an analog signal is stored according to one clock signal, and generates a threshold voltage according to another clock signal associated with a first capacitor. Lastly, comparing the analog signal with the threshold voltage, and outputs the digital signal thereby.

The foregoing clock signals comprise a first clock signal and a second clock signal, for example. The first and second clock signals have the same frequency but not overlap. The foregoing steps of generating the threshold voltage in the foregoing converting method further comprise the steps as follows. Firstly, a second capacitor is provided for conducting the analog signal to the second capacitor according to the first clock signal. Secondly, storing a partial of the charges of the analog signal in the second capacitor. Lastly conducting the first capacitor and the second capacitor according to the second clock signal, thus the threshold voltage is generated based on the portion of charges associated with the first capacitor.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

The invention claimed is:

1. An analog-to-digital signal converter circuit, comprising:
    a first capacitor, having a first terminal and a second terminal, wherein said first terminal is coupled to a first voltage level;
    a clock generator, for generating a plurality of clock signals;
    a switching capacitor network, coupled to said second terminal of said first capacitor, wherein the switching capacitor network receives an analog signal and said clock signals, said switching capacitor network stores a portion of charges of said analog signal, and outputs said portion of charges according to said clock signals to charge the first capacitor, and generates a threshold voltage associated with said first capacitor; and
    a comparator, for comparing said threshold voltage with said analog signal and outputting a digital signal.

2. The circuit of claim 1, wherein said switching capacitor network comprises:
    a plurality of sensor control switches, wherein one of said sensor control switches is controlled by said clock signals for turning on/off, said sensor control switches are series-connected to form a series structure having a first terminal and a second terminal, said first terminal of said series structure receiving said analog signal and said second terminal of series structure being coupled to said second terminal of said first capacitor so as to output said threshold voltage; and
    at least a second capacitor, having a first terminal and a second terminal, said first terminal of said second capacitor being coupled to a connection between two adjacent sensor control switches in said series structure, said second terminal of said second capacitor being coupled to a second voltage level.

3. The circuit of claim 2, wherein said of clock signals have a same frequency wit different phases respectively.

4. The circuit of claim 3, wherein said clock signals do not overlap.

5. The circuit of claim 4, wherein said sensor control switches are MOSFETs.

6. The circuit of claim 5, wherein said first voltage level and said second voltage level are DC voltage levels.

7. The circuit of claim 1, wherein said circuit applies to a frequency-shift keying communication system.

8. The circuit of claim 1, wherein said circuit applies to an amplitude-shift keying communication system.

9. The circuit of claim 1, wherein said circuit applies to an on/off keying communication system.

10. A method for converter an analog signal to a digital signal, comprising:
    providing a first capacitor and a plurality of clock signals;
    storing a portion of charges of an analog signal according to said clock signals;
    generating a threshold voltage according to said clock signals based on said portion of charges associated with said first capacitor; and
    comparing said threshold voltage with said analog signal in order to output a digital signal.

11. The method for converter of claim 10, wherein said clock signals comprises a first clock signal and a second clock signal, said first and second clock signals have a same frequency but not overlapping, and said step of generating said threshold voltage further comprising:
    providing a second capacitor;
    conducting said analog signal to said second capacitor according to said first clock signal to store said portion of charges of said analog signal in said second capacitor; and
    conducting said first capacitor and said second capacitor in response to said second clock signal in order to generate said threshold voltage based on said portion of charges of said analog signal associated with said first capacitor.

* * * * *